United States Patent
Downes et al.

(10) Patent No.: US 6,179,631 B1
(45) Date of Patent: *Jan. 30, 2001

(54) ELECTRICAL CONTACT FOR A PRINTED CIRCUIT BOARD

(75) Inventors: Stuart D. Downes, Milford; Leonard A. Merrill, Millis, both of MA (US)

(73) Assignee: EMC Corporation, Hopkinton, MA (US)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/975,892

(22) Filed: Nov. 21, 1997

(51) Int. Cl.[7] ................................................ H01R 13/40
(52) U.S. Cl. ............................ 439/83; 439/876; 228/255; 228/246; 228/56.3
(58) Field of Search .................... 439/83, 876; 228/56.3, 228/180.1, 246, 255

(56) References Cited

U.S. PATENT DOCUMENTS

| | | | |
|---|---|---|---|
| 3,541,496 | * 11/1970 | Castellani | 339/220 |
| 3,601,750 | 8/1971 | Mancini | 339/17 |
| 3,977,075 | * 8/1976 | Lynch et al. | 29/628 |
| 4,053,199 | * 10/1977 | Hollyday et al. | 439/83 |
| 4,443,053 | 4/1984 | Astbury | 339/221 |
| 4,516,103 | 5/1985 | Arnold | 336/65 |
| 4,691,971 | 9/1987 | Hahn | 439/78 |
| 4,746,301 | 5/1988 | Key | 439/82 |
| 4,758,187 | 7/1988 | Guglhör | 439/741 |
| 4,776,807 | 10/1988 | Triner et al. | 439/82 |
| 4,795,378 | 1/1989 | Tomizu et al. | 439/751 |
| 4,936,797 | * 6/1990 | Wehrle et al. | 439/82 |
| 4,968,263 | * 11/1990 | Silbernagel et al. | 439/83 |
| 5,024,623 | * 6/1991 | Bauman et al. | 439/876 |
| 5,029,748 | * 7/1991 | Lauterbach et al. | 228/180.1 |
| 5,289,117 | 2/1994 | Van Loan et al. | 324/158 |
| 5,410,452 | 4/1995 | Sinclair et al. | 361/791 |
| 5,571,033 | * 11/1996 | Kinsey, Jr. et al. | 439/876 |
| 5,589,669 | 12/1996 | Downes et al. | 174/266 |

FOREIGN PATENT DOCUMENTS

| | | | |
|---|---|---|---|
| 2543421 | * 4/1976 | (DE) | 439/876 |
| 2735746 | * 2/1979 | (DE) . | |
| 2812767 | * 9/1979 | (DE) | 439/876 |
| 1 521 074 | 8/1978 | (GB) . | |
| 4-39877 | * 2/1992 | (JP) | 439/876 |

* cited by examiner

Primary Examiner—Ren Yan
(74) Attorney, Agent, or Firm—Wolf, Greenfield & Sacks, P.C.

(57) ABSTRACT

An electrical contact that is mounted on a printed circuit board to provide an electrical connection to the printed circuit board. The contact has the structural integrity of a through-hole component with the capability of being soldered to the circuit board using a surface mount reflow process. The contact includes a pair of elongated, conductive pins with a base disposed therebetween, and a solder preform supported on one of the conductive pins adjacent the base. The pin supporting the solder preform is insertable into a plated-through hole on the circuit board so that the solder preform can be reflowed into the hole along the pin to form a solder joint between the contact and the hole. The contact may include a retainer to secure the solder preform to the pin and the end of the base adjacent the pin may be beveled to facilitate gas ventilation from the hole during the soldering process. The base may be configured so that it can be grasped with a test instrument or support a wire connection to the contact. The contact may be symmetrical so that the solder preform can be supported on either conductive pin.

24 Claims, 2 Drawing Sheets

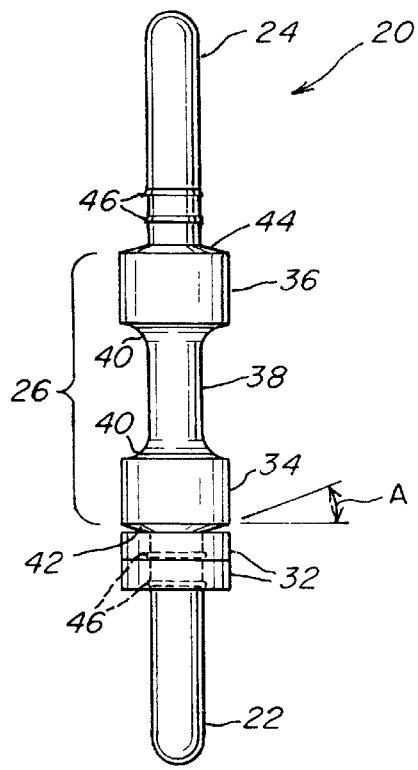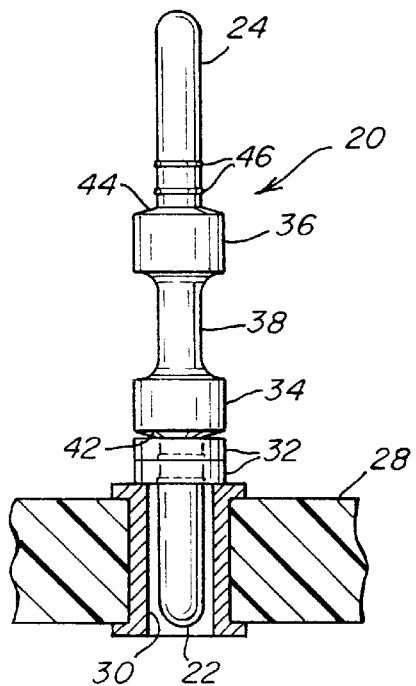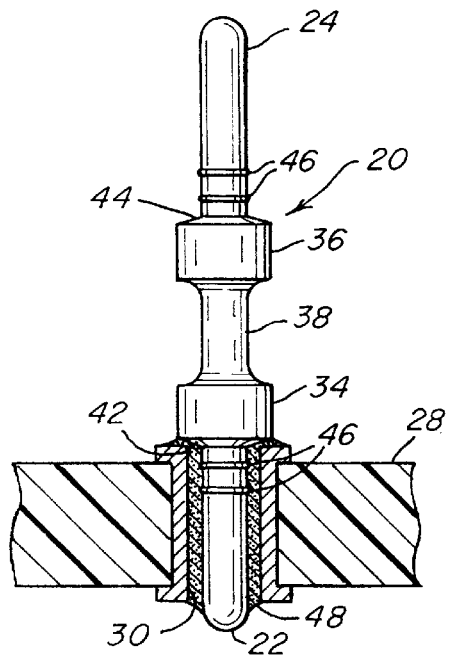

ELECTRICAL CONTACT FOR A PRINTED CIRCUIT BOARD

BACKGROUND OF THE INVENTION

1. Field of the Invention

The present invention relates to an electrical contact, and more particularly to an electrical pin contact for mounting on a printed circuit board.

2. Description of Related Art

Electrical pin contacts are typically mounted to a printed circuit board for establishing electrical interconnections to the circuitry of the board. For example, one or more contacts can be mounted to a circuit board to provide test pin connections that can be probed for testing or troubleshooting the board. Pin contacts can also provide an interface for an electrical connector or other socket-type device to interconnect a board to other electronic components.

Electronic components, including pin contacts, are generally configured for mounting on a printed circuit board as either a surface mount component or a through-hole component. A surface mount component includes leads that are soldered directly to surface mount pads provided on the outer surfaces of the circuit board. Conventionally, the component leads are pressed into a layer of solder paste, which includes both solder and flux, deposited on the pads. Once the surface mount components are assembled to the circuit board, the board and components are heated to reflow the solder and form solder joints between the leads and pads.

A through-hole component includes elongated leads that are inserted into plated-through holes extending through the circuit board. Conventionally, the component leads are soldered to the plated-through holes using a wave soldering process that fills the holes with solder to electrically and mechanically connect the leads to the holes.

When a printed circuit board includes both surface mount components and through-hole components, separate manufacturing steps are typically required to solder the various components to the board. Generally, the surface mount components are first assembled and reflow soldered to the board with the through-hole components being subsequently assembled and wave soldered to the board. In addition to increasing the number of process steps, this process can impact the overall reliability of the board since the surface mount components and their solder joints are subjected to the thermal shock of the wave soldering process.

Surface mount pin contacts have been proposed for surface mount applications so that the pin contacts may be reflow soldered at the same time as the surface mount components. Surface mount pin contacts, however, tend to have less structural integrity than a through-hole contact. Additionally, the solder joint between the surface mount pad and the contact is at substantial risk to fail, since the contact typically includes no support structure that would distribute forces applied to the contact away from the solder joint. Surface mount electrical contacts used as test pins are particularly prone to structural and solder joint failures since they are typically subjected to relatively large forces when probed, grasped and interconnected during testing on a board. The lack of support structure also makes it difficult to maintain a surface mount contact precisely positioned on a circuit board during the assembly process.

It is an object of the present invention to provide an improved electrical contact and a method of mounting the electrical contact in a plated-through hole on a printed circuit board.

SUMMARY

The present invention is an electrical contact having the structural integrity of a through-hole component with the capability of being soldered to a printed circuit board using a surface mount reflow process. The contact includes a pin that is insertable through a plated-through hole in the printed circuit board. A solder preform supported on the pin may be surface mount reflowed to form a solder joint between the contact and the plated-through hole.

In one illustrative embodiment of the invention, the electrical contact comprises a base including opposing first and second ends, a first conductive pin attached to the first end of the base, and a second conductive pin attached to the second end of the base. The first conductive pin is insertable into the plated-through hole. The contact also comprises at least one solder preform supported on the first conductive pin that is to be disposed between the first end of the base and the printed circuit board when the first conductive pin is inserted through the plated-through hole.

In another illustrative embodiment of the invention, the electrical contact comprises a base, a first conductive pin, a second conductive pin, and at least one solder preform supported on one of the first and second conductive pins. Each of the first and second conductive pins is insertable into the plated-through hole with the solder preform to be disposed between the base and the printed circuit board when the one of the first and second conductive pins is inserted through the plated-through hole. The base includes a central portion, a first flange with first and second ends and a second flange with first and second ends. The second end of the first flange is attached to a first end of the central portion and the first end of the second flange is attached to a second end of the central portion. The first conductive pin is attached to the first end of the first flange and the second conductive pin is attached to the second end of the second flange.

In a further illustrative embodiment of the invention, a method is provided for mounting an electrical contact to a printed circuit board having a plated-through hole. The method comprises steps of providing an electrical contact that includes a base, a first conductive pin attached to a first end of the base, a second conductive pin attached to a second end of the base, and a solder preform supported on the first conductive pin; inserting the first conductive pin into the plated-through hole of the printed circuit board so that the solder preform is disposed between the base and the printed circuit board; and reflowing the solder preform into the plated-through hole along the first conductive pin to form a solder joint between the electrical contact and the plated-through hole.

BRIEF DESCRIPTION OF THE DRAWINGS

The foregoing and other objects and advantages of the present invention will become apparent with reference to the following detailed description when taken in conjunction with the accompanying drawings in which:

FIG. 1 is a side view of an electrical contact according to one illustrative embodiment of the present invention;

FIG. 2 is a side view of the electrical contact of FIG. 1 supported in a plated-through hole on a printed circuit board;

FIG. 3 is a side view of the electrical contact illustrated in FIG. 2 soldered in the plated-through hole on the printed circuit board;

DETAILED DESCRIPTION OF ILLUSTRATIVE EMBODIMENTS

Figure 4:
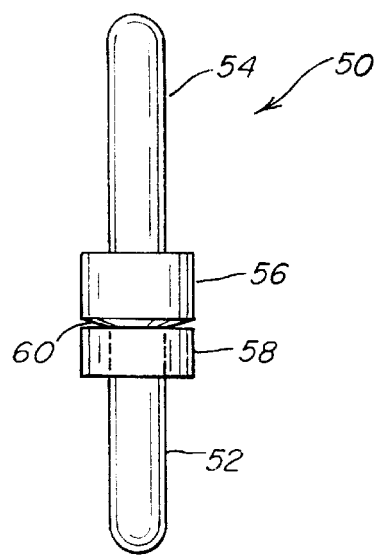
FIG. 4 is a side view of an electrical contact according to another illustrative embodiment of the present invention.

In accordance with one illustrative embodiment of the invention, an electrical contact is provided for being mounted on a printed circuit board to establish an electrical connection to the circuit board. The electrical contact may be inserted into a plated-through hole in the circuit board and soldered using a surface mount intrusive reflow process. The contact may be manually mounted or automatically mounted onto the board using an automated assembly process. To enhance automated assembly processes, a plurality of the electrical contacts may be provided in a component magazine or on a reel tape. It should be appreciated that the illustrative embodiments discussed below are provided merely for illustrative purposes, and that numerous other implementations are possible.

In one illustrative embodiment of the invention shown in FIGS. 1–3, the electrical contact 20 includes first and second elongated, conductive pins 22, 24 attached to first and second ends of a base 26 that is configured to support the contact 20 on a printed circuit board 28 when the first pin 22 is inserted into a plated-through hole 30 on the circuit board. The contact 20 also includes solder preform 32, supported along a portion of the first pin 22, that is to be heated and surface mount reflowed into the plated-through hole 30 to form a solder joint between the contact and the circuit board. The second pin 24 provides an interface to the circuit board that may be probed or mated with other components.

The base 26 includes first and second flanges 34, 36 that are spaced apart and attached to opposite ends of a central portion 38. The first flange 34 supports the contact on the circuit board 28 and controls the depth of insertion of the first pin 22 into the plated-through hole 30. The second flange 36 may be used to counterbalance the first flange 34 so that the center of gravity of the contact can be controlled to suit a particular manufacturing process. For example, the center of gravity may be located toward the second pin 24 so that gravity can be used to properly orient the first pin 22 to receive the solder preform 32 during assembly of the contact.

As illustrated, the central portion 38 of the base has a smaller cross-sectional size compared to the first and second flanges 34, 36 to create a thermal barrier therebetween so that the first flange 34 can be heated efficiently to reflow the solder preform 32. The central portion 38 also provides an area on the contact that can be securely grasped with a test clip or other instrument, as well as a convenient area to add wire for an external connection to the contact. As shown, the ends of the central portion 38 may include a radial transition 40 to the flanges 34, 36 to enhance the structural integrity of the contact by reducing areas of stress concentration.

The contact 20 is preferably symmetrical so that the solder preform 32 can be placed on either the first or second pin 22, 24 to enhance the manufacture of the contact and the assembly of the contact to a circuit board. The contact may be formed to have circular conductive pins and a circular base using a screw machine process. Circular pins are efficient at filling a plated-through hole to reduce the amount of solder preform necessary to form the solder joint. As illustrated, the conductive pins 22, 24 include hemispherical tips to enhance the ability to insert one end of the contact in a plated-through hole and to mate the opposite end of the contact with other electronic components, interconnection devices, test instruments and the like.

As illustrated, a pair of annular solder preforms 32 are stacked and slid onto the first pin 22 adjacent the base 26. Since the amount of solder required to form a reliable solder joint is a function of the plated-through hole 30 and the first pin 22 sizes, thin layers of solder preform 32 are desirable to provide flexibility for accommodating a particular hole/pin configuration. It is to be understood, however, that a single solder preform with the proper amount of solder may be provided on the contact. The ratio of the solder preform height to its diameter (i.e., the aspect ratio) is preferably a maximum of 1.5 to ensure that the solder properly reflows to fill the hole and form the solder joint.

The first and second ends 42, 44 of the base 26 may be beveled to provide a means for facilitating the ventilation of gases from the plated-through hole during the soldering process to increase the reliability of the solder joint. Unless vented, gases resulting from the activation of the solder flux may become entrapped in the solder as it solidifies and create voids that can reduce the reliability of the solder joint. Preferably, the first and second ends 42, 44 are beveled at an angle A to allow sufficient gas ventilation while minimizing the gap between the base 26 and the plated-through hole 30 to ensure the formation of a reliable solder joint. In one embodiment, the angle A is approximately 8°–15° from a horizontal plane that is perpendicular to the longitudinal axis of the contact. It is to be understood, however, that this angle is exemplary and may be varied as would be appreciated by one of skill in the art due to various factors of the solder reflow process including flux composition, thermal profile of the furnace, gas atmosphere within the furnace, pin plating, and the like. Additionally, the base 26 may include a single beveled end, such as the first end 42.

The contact 20 may include a retainer for holding the solder preform 32 on the pin to ensure that the preform is properly positioned and secured on the pin during handling and assembly processes. In one embodiment, a pair of radial projections 46 extends continuously about the circumference of the first pin 22 adjacent the base 26 to hold the preform 32 adjacent the base and away from the pin tip. As illustrated, the projections 46 are provided on each pin 22, 24 so that solder preform 32 can be secured to either pin of the contact. The projections 46 may have a radial shape, a barb shape or any other suitable profile that prevents the inadvertent removal of the solder preform from the pin. It is to be appreciated that the number of projections 46 may vary for a particular application. Additionally, the projections may include a plurality of circumferentially spaced members that are disposed about the periphery of the pin.

As illustrated in FIGS. 2 and 3, the first pin 22 is inserted into a plated-through hole 30 of a printed circuit board 28 with the solder preform 32 disposed between the base 26 of the contact and the board so that the base is elevated above the surface of the board. Upon insertion, the first pin 22 extends along a substantial length of the hole 30 and cooperates with the hole to stabilize and maintain the contact 20 in an upright position relative to the board. The contact 20 may be inserted in the hole 30 either manually or using automated assembly processes. In one embodiment, a layer of solder paste (not shown) is deposited over the plated-through hole 30 to accurately control the application of flux to the contact and hole for a reliable solder joint. In another embodiment, the solder preform 32 may be coated with flux to achieve the desired wetting of the joint and pin as the preform is reflowed.

To solder the contact 20 to the circuit board 28, either the entire circuit board, including all the components mounted to the board, or the individual contact is locally heated to a predetermined temperature sufficient to melt the solder preform 32. When melted, the solder reflows into the hole 30 along the length of the first pin 22 to substantially fill the hole and form a solder joint 48. As the solder reflows, the contact 20 drops through the hole until the base 26 is essentially resting on the board and the tip of the first pin protrudes from hole. A layer of solder, approximately 1–2 mils thick (0.001–0.002 inches), preferably separates the base of the contact from the circuit board.

In one embodiment, the electrical contact 20 has an overall length of approximately 0.390 inches, a base length of approximately 0.140 inches with the first and second flanges each having a length of approximately 0.035 inches, and pin lengths of approximately 0.125 inches each. The first and second flanges each has a diameter of approximately 0.058 inches, and the pins and central portion each has a diameter of approximately 0.028/0.030 inches. Each solder preform 32 has a maximum outer diameter of approximately 0.060 inches and a thickness of approximately 0.015 inches.

A contact having this configuration is particularly suited for a 0.090 inch thick circuit board and a plated-through hole having a diameter of approximately 0.037/0.040 inches with a pad diameter of approximately 0.060 inches. It is to be appreciated that the dimensions of the electrical contact may be varied to suit other particular applications. For example, the second pin may have length and/or diameter that differs from the first pin to suit a particular interface requirement for a connector or probe.

In one embodiment, the electrical contact 20 is made from a brass material, such as CDA C36000 brass, plated with a minimum 0.01 mil thick layer of gold over a minimum 0.05 mil thick layer of nickel. The gold plating is particularly suited for high frequency applications. Other free machining conductive materials, such as copper, phosphor bronze or beryllium copper, and other plating, such as tin or tin/lead, may be used as would be appreciated by one of skill in the art. The solder preform is made from a tin/lead alloy, such as an alloy comprising 63% tin and 37% lead.

In another illustrative embodiment shown in FIG. 4, an electrical contact 50 includes first and second elongated, conductive pins 52, 54 attached to opposite ends of a base 56 with a solder preform 58 supported on the first conductive pin 52. The base includes a single flange having the end 60 adjacent the first pin 52 beveled to facilitate the ventilation of gases when the first pin is soldered in a plated-through hole. It is to be appreciated that the contact 50 may be symmetrical, including each end of the base 56 being beveled, so that either pin can be soldered in a plated-through hole. The contact 50 may include a retainer, such as the radial projections described above, on one or both pins 52, 54 to hold the solder preform 58 on the pin.

Figure 5:
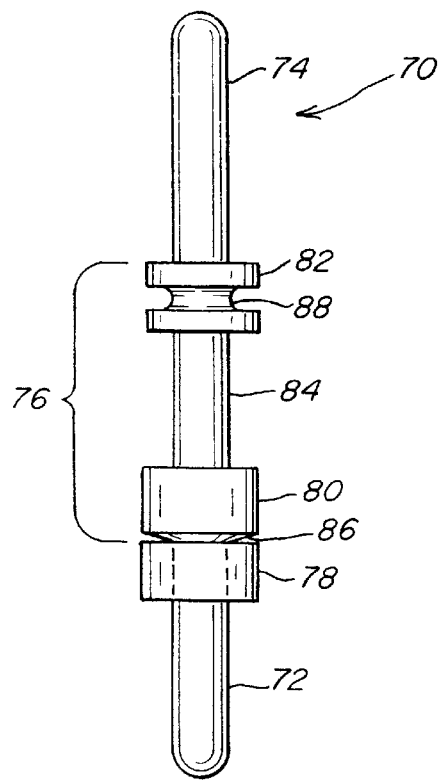
FIG. 5 is a side view of an electrical contact according to a further illustrative embodiment of the present invention.

In a further illustrative embodiment shown in FIG. 5, an electrical contact 70 includes first and second elongated, conductive pins 72, 74 attached to opposite ends of a base 76 with a solder preform 78 supported on the first conductive pin. The base 76 includes first and second flanges 80, 82 that are spaced apart and attached to opposite ends of a central portion 84. The first end 86 of the first flange 80 adjacent the first pin 72 is beveled to facilitate the ventilation of gases during the soldering process. The second flange 82 has a circumferential groove 88 disposed about its periphery to receive a test clip or wire connections to the contact. The contact 70 may include a retainer, such as the projections described above, for holding the solder preform 78 on the first pin 72.

An electrical contact according to the illustrative embodiments described above allows the use of a surface mount reflow process that creates a reliable solder joint having the electrical and structural properties associated with a through-hole contact without subjecting other surface mount components on the board to the thermal shock associated with multiple soldering steps. Since it is only necessary to heat the solder preform to flow the solder into the hole, a contact may be readily added to an assembled circuit board with minimal risk of damaging the circuit board, such as by lifting pads off the board. Consequently, a printed circuit board may be assembled with a minimal number of test pin contacts necessary for conducting production testing. Should an individual board require post assembly debugging, one or more contacts may be soldered to plated-through holes or vias provided on the board. The present contact is particularly suited for such post assembly insertion, since the solder preform has the proper amount of solder to form a reliable joint and the solder preform can be reflowed by delivering heat to the preform through one of the pins. Reflowing the solder preform in this manner does not require the level of skill necessary for hand soldering a contact to an isolated via or surface mount pad.

Having described several embodiments of the invention in detail, various modifications and improvements will readily occur to those skilled in the art. Such modifications and improvements are intended to be within the spirit and scope of the invention. Accordingly, the foregoing description is by way of example only and is not intended as limiting. The invention is limited only as defined by the following claims and their equivalents.

What is claimed is:

1. An electrical contact for mounting on a printed circuit board that has a plated-through hole with a diameter, the electrical contact comprising:

a base including opposing first and second ends, the base having an outer dimension that is greater than the diameter of the plated-through hole to prevent the base from being inserted into the plated-through hole;

a first conductive pin attached to the first end of the base;

a second conductive pin attached to the second end of the base, at least one of the first and second conductive pins being insertable into the plated-through hole; and at least one solder preform supported on the at least one of the first and second conductive pins, the at least one of the first and second conductive pins including a retainer to secure the solder preform thereon, the solder preform having an outer dimension that is greater than the diameter of the plated-through hole so that the solder preform is disposed between and spaces one of the first and second ends of the base from the printed circuit board when the at least one of the first and second conductive pins is inserted through the plated-through hole, the solder preform to be reflowed into the plated-through hole along the at least one of the first and second conductive pins to form a solder joint between the electrical contact and the plated-through hole.

2. The electrical contact recited in claim 1, wherein the retainer includes at least one radial projection.

3. The electrical contact recited in claim 2, wherein the projection extends about the periphery of the at least one of the first and second conductive pins.

4. The electrical contact recited in claim 3, wherein the projection includes an annular ring disposed about the entire periphery of the at least one of the first and second conductive pins.

5. The electrical contact recited in claim 1, wherein the first conductive pin is coaxial with the second conductive pin.

6. The electrical contact recited in claim 1, wherein each of the first and second conductive pins is insertable into the plated-through hole, the at least one solder preform being supported on one of the first and second conductive pins, each of the first and second conductive pins including a retainer to secure the at least one solder preform thereon.

7. The electrical contact recited in claim 6, wherein the retainer on each of the first and second conductive pins includes at least one annular ring disposed about the periphery of the first and second conductive pins.

8. The electrical contact recited in claim 7, wherein the at least one annular ring on each of the first and second conductive pins includes a plurality of annular rings disposed along the length of the first and second conductive pins.

9. The electrical contact recited in claim 6, wherein the retainer on each of the first and second conductive pins includes a plurality of radial projections disposed along the length of the first and second conductive pins.

10. An electrical contact for mounting on a printed circuit board that has a plated-through hole with a diameter, the electrical contact comprising:
    a base including opposing first and second ends, the base having an outer dimension that is greater than the diameter of the plated-through hole to prevent the base from being inserted into the plated-through hole, the base having a periphery and a groove disposed about the periphery that is adapted to be grasped by a test instrument;
    a first conductive pin attached to the first end of the base, the first conductive pin being insertable into the plated-through hole;
    a second conductive pin attached to the second end of the base; and
    at least one solder preform supported on the first conductive pin, the solder preform having an outer dimension that is greater than the diameter of the plated-through hole so that the solder preform is disposed between and spaces the first end of the base from the printed circuit board when the first conductive pin is inserted through the plated-through hole, the solder preform to be reflowed into the plated-through hole along the first conductive pin to form a solder joint between the electrical contact and the plated-through hole.

11. An electrical contact for mounting on a printed circuit board that has a plated-through hole with a diameter, the electrical contact comprising:
    a base including a central portion, a first flange with first and second ends and a second flange with first and second ends, the second end of the first flange being attached to a first end of the central portion and the first end of the second flange being attached to a second end of the central portion, the first and second flanges each having an outer dimension that is greater than the diameter of the plated-through hole to prevent the base from being inserted into the plated-through hole;
    a first conductive pin attached to the first end of the first flange;
    a second conductive pin attached to the second end of the second flange, each of the first and second conductive pins being insertable into the plated-through hole; and
    at least one solder preform supported on one of the first and second conductive pins, the solder preform to be disposed between the base and the printed circuit board when the one of the first and second conductive pins is inserted through the plated-through hole, the solder preform to be reflowed into the plated-through hole along the one of the first and second conductive pins to form a solder joint between the electrical contact and the plated-through hole.

12. The electrical contact recited in claim 11, wherein the central portion is constructed and arranged to be grasped with a test instrument.

13. The electrical contact recited in claim 11, wherein the central portion is constructed and arranged to support a wire connection to the contact.

14. The electrical contact recited in claim 11, wherein the first conductive pin and the first flange are symmetrical to the second flange and the second conductive pin.

15. The electrical contact recited in claim 14, wherein the first conductive pin is coaxial with the second conductive pin.

16. The electrical contact recited in claim 11, wherein the first end of the first flange and the second end of the second flange are beveled to vent gases from the plated-through hole during a soldering process when the one of the first and second conductive pins is inserted in the plated-through hole.

17. The electrical contact recited in claim 11, wherein each of the first and second conductive pins includes a plurality of radial projections that are constructed and arranged to secure the solder preform to the one of the first and second conductive pins.

18. The electrical contact recited in claim 11, wherein the solder preform has an outer diameter that is greater than the diameter of the plated-through hole.

19. A method of mounting an electrical contact to a printed circuit board having a plated-through hole with a diameter, the method comprising steps of:
    (a) providing an electrical contact that includes a base, a first conductive pin attached to a first end of the base, a second conductive pin attached to a second end of the base, and a solder preform supported on the first conductive pin, each of the base and the solder preform having an outer dimension that is greater than the diameter of the plated-through hole to prevent the base and the solder preform from being inserted into the plated-through hole;
    (b) inserting the first conductive pin into the plated-through hole of the printed circuit board so that the solder preform is disposed between and spaces the base from the printed circuit board; and
    (c) reflowing the solder preform into the plated-through hole along the first conductive pin to form a solder joint between the electrical contact and the plated-through hole, while permitting the electrical contact to drop through the plated-through hole as the solder preform is reflowed along the first conductive pin.

20. The method recited in claim 19, wherein step (a) includes providing the electrical contact with the first end of the base being beveled, and step (c) includes venting gases from the plated-through hole.

21. The method recited in claim 19, wherein step (b) occurs after other electronic components have been soldered to the printed circuit board.

22. The method recited in claim 21, wherein step (c) includes locally heating the solder preform.

23. The method recited in claim 19, further comprising a step of depositing a layer of solder paste over the plated-through hole prior to step (b).

24. An apparatus comprising:
    a printed circuit board that has a plated-through hole with a diameter; and an electrical contact supported on the printed circuit board, the electrical contact comprising:
  a base including a central portion, a first flange with first and second ends and a second flange with first and second ends, the second end of the first flange being attached to a first end of the central portion and the first end of the second flange being attached to a second end of the central portion, the first and second flanges each having an outer dimension that is greater than the diameter of the plated-through hole to prevent the base from being inserted into the plated-through hole;
  a first conductive pin attached to the first end of the first flange;
  a second conductive pin attached to the second end of the second flange, one of the first and second conductive pins being inserted into the plated-through hole; and
  at least one solder preform supported on the one of the first and second conductive pins and being disposed between the base and the printed circuit board, the solder preform to be reflowed into the plated-through hole along the one of the first and second conductive pins to form a solder joint between the electrical contact and the plated-through hole.

* * * * *